United States Patent [19]
Brady et al.

[11] Patent Number: 5,786,626
[45] Date of Patent: Jul. 28, 1998

[54] THIN RADIO FREQUENCY TRANSPONDER WITH LEADFRAME ANTENNA STRUCTURE

[75] Inventors: Michael J. Brady, Brewster, N.Y.; Normand Gilles Favreau, Dunham; Francois Guindon, Stukely sud Qc, both of Canada; Paul Andrew Moskowitz, Yorktown Heights, N.Y.; Philip Murphy, New Fairfield, Conn.

[73] Assignee: IBM Corporation, Armonk, N.Y.

[21] Appl. No.: 621,784

[22] Filed: Mar. 25, 1996

[51] Int. Cl.$^6$ .......... H01L 23/495; H01L 23/48; H01L 23/52; H01L 29/40

[52] U.S. Cl. .......... 257/673; 257/666; 257/674; 257/735; 257/737; 343/873; 439/916

[58] Field of Search .......... 257/673–4, 735, 257/7, 666; 343/873; 439/916

[56] References Cited

U.S. PATENT DOCUMENTS 5,528,222  6/1996  Moskowitz et al. .......... 340/572

FOREIGN PATENT DOCUMENTS

| | | |
|---|---|---|
| 0481776 | 4/1992 | European Pat. Off. |
| 0595549 | 5/1994 | European Pat. Off. |
| 4319878 | 12/1993 | Germany |
| 9119302 | 12/1991 | WIPO |
| 3903551 | 5/1993 | WIPO |
| 9411846 | 5/1994 | WIPO |

OTHER PUBLICATIONS

Patent Abstracts of Japan, vol. 13, No. 560 (M–906) 13 Dec. 1989 & JP, A, 01 234 296 (NEC Corp.) 19 Sep. 1989.

*Primary Examiner*—Teresa M. Arroyo
*Attorney, Agent, or Firm*—Louis J. Percello

[57] ABSTRACT

A novel radio frequency transponder (tag) with a minimum of components and connects is thin and flexible because these components and connects can be unsupported by a substrate layer. This is accomplished by using a conducting leadframe structure not only as a connection medium but also as a circuit element, i.e., the transponder antenna. In various preferred embodiments, the leadframe is mechanically positioned and fixably attached to a circuit chip so that the leadframe (antenna) is self supporting. A protective coating can be added where the leadframe is attached to the circuit chip. Further a protective surrounding can envelops the entire leadframe antenna, circuit chip, and, if provided, the protective coating.

32 Claims, 11 Drawing Sheets

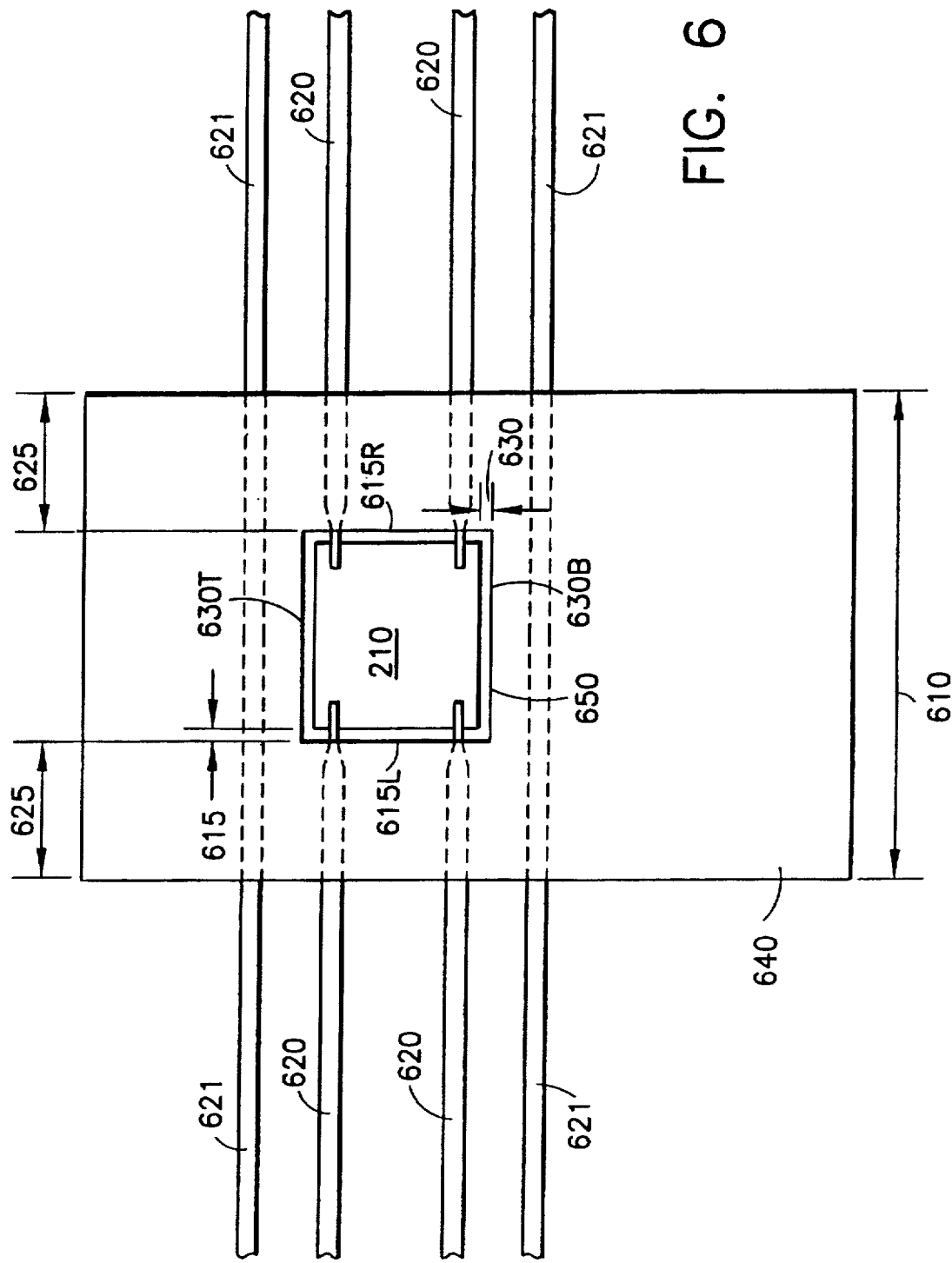

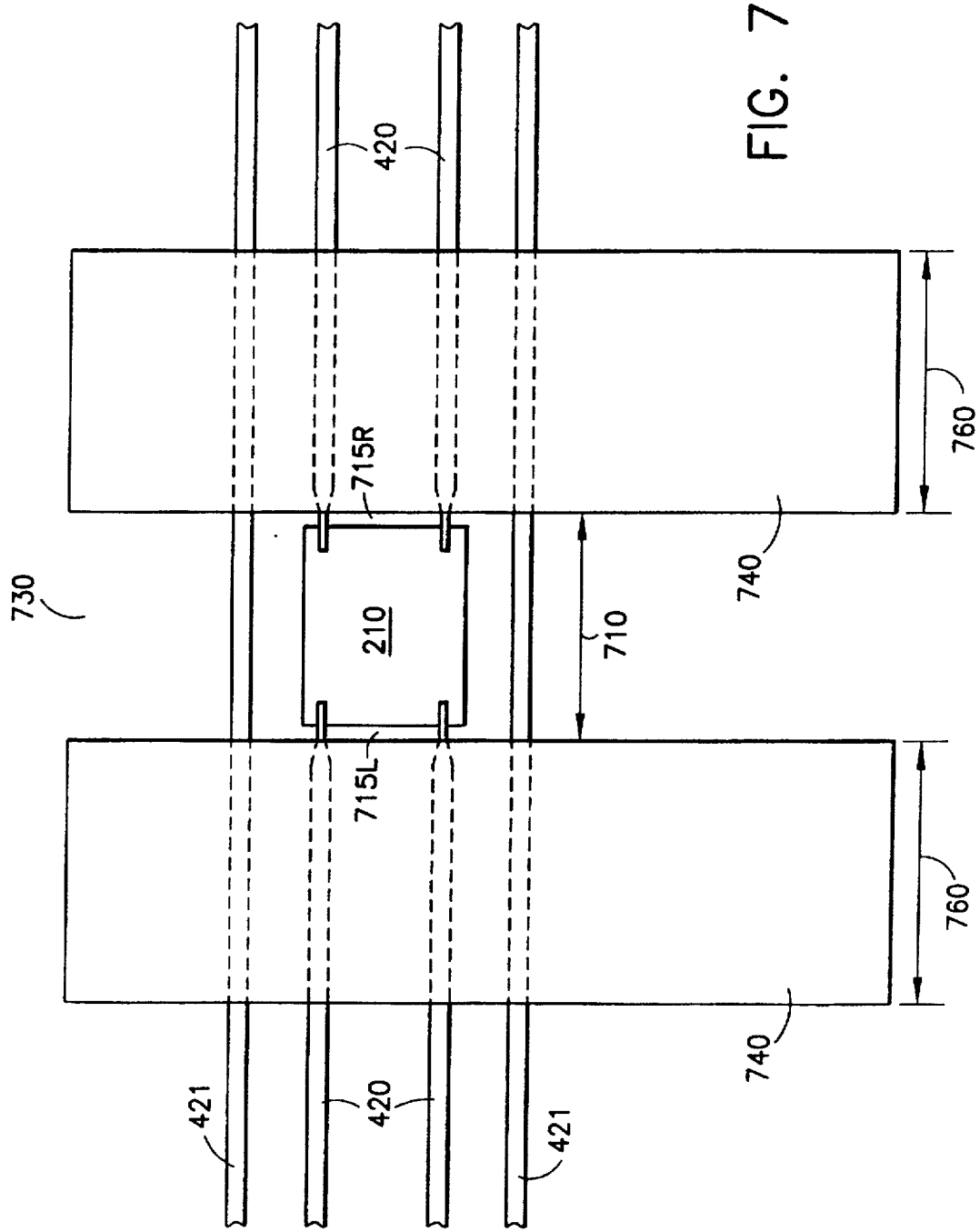

5,786,626

THIN RADIO FREQUENCY TRANSPONDER WITH LEADFRAME ANTENNA STRUCTURE

FIELD OF THE INVENTION

This invention relates to the field of radio frequency transponders. More specifically, the invention relates to a thin radio frequency tag with a leadframe antenna structure.

BACKGROUND OF THE INVENTION

Radio frequency transponders are used in many applications. One application, Radio Frequency Identification (RF ID), is just one of many identification technologies for identifying objects. The heart of the RF ID system lies in an information carrying tag. The tag functions in response to a coded RF signal received from a base station. Typically, the tag reflects the incident RF carrier back to the base station. Information is transferred as the reflected signal is modulated by the tag according to its programmed information protocol.

The tag consists of a semiconductor chip having RF circuits, logic, and memory. The tag also has an antenna, often a collection of discrete components, capacitors and diodes, for example, a battery in the case of active tags, a substrate for mounting the components, interconnections between components, and a means of physical enclosure. One variety of tag, passive tags, has no battery. They derive their energy from the RF signal used to interrogate the tag. In general, RF ID tags are manufactured by mounting the individual elements to a circuit card. This is done by using either short wire bond connections or soldered connections between the board and the circuit elements: chip, capacitors, diodes, antenna. The circuit card may be of epoxy-fiberglass composition or ceramic. The antennas are generally loops of wire soldered to the circuit card or consist of metal etched or plated on a circuit card. The whole assembly may be enclosed in a plastic box or molded into a three dimensional plastic package.

Some prior art focuses on niche applications for RF tags, e.g., the identification of railway boxcars. These tags tend to be quite large and are made of discrete components on circuit boards mounted in solid, non-flexible casings. Other applications exist in the automatic toll industry, e.g. on thruway and bridge tolls. RF tags are being tested for uses as contactless fare cards for buses.

Smaller tags, e.g., those used in employee identification badges and security badges, have been produced. Animal identification tags are also commercially available as are RF ID systems for tracking components in manufacturing processes.

Various tag designs and uses are disclosed in U.S. Pat. No. 4,656,463 to Anders et al., filed on Apr. 21, 1983 which is herein incorporated by reference in its entirety.

The prior art also discloses tags in relatively thin RF tag packages.

Tags exist that have the length and width of a standard credit card. However, these cards typically are over 2.5 mm thick and have a non-flexible casing. Tags also exist that have a credit card size length and width but with bumps where the circuit is placed that causes them to be too thick to fit in card reader machinery.

While some electronic article surveillance (EAS), e.g. antitheft devices, are thin (0.3 mm) they typically contain limited amounts, (i.e., only one bit) of information. Some of these devices can be turned off once but cannot be reactivated.

FIG. 1A describes one structure of a radio frequency tag 105. The tag 105 has a chip 110 mounted on a substrate 115. The chip 110 has contacts 120 that are connected to circuitry on the substrate 115 by wire bonds 125. An encapsulation material 130 covers the chip for environmental protection. The thickness of this tag 105 is determined by the combined thicknesses of the chip components. Typically, substrates in these tags are at least 10 mils, 0.25 mm, in thickness, the chip 110 along with the high loop 122 of the bond vary from 20 to 40 mils, 0.5 to 1 mm, in thickness and the encapsulation 130 is about 10 mils, 0.25 mm in thickness. As a result, tags 105 of this structure vary from a minimum of 40 to 60 mils, 1 to 1.5 mm, in thickness. This structure is too thick for many potential tag applications.

FIG. 1B shows another structure 150 showing a chip 140 with the chip contacts 152 connected to circuitry contacts 155 with conducting adhesive 160. The substrate 165 of this structure 150 is typically made as a FR4/printed circuit (thickness 40 to 60 mils, 1 to 1.5 mm) or flexible substrate (10 mils, 0.25 mm). The chip 140 and adhesive 160 add another 20 to 40 mils, 0.5 to 1 mm, to the thickness and the encapsulation 165 adds still another 10 to 20, 0.25 to 0.5 mm mils in structure 150 thickness. This structure therefore can vary in thickness from 80 to 130 mils, 2 to 3.5 mm, making it thicker than the structure in FIG. 1.

Other structures, thicker than one millimeter, are known in the art. These include quad flat pak (QFP) and/or small outline pak (SOP) as components. Structures made with these components are at least 1 mm thick and usually 2 to 3 mm thick. One typical prior art embodiment of RF tags and RF tag systems is disclosed in U.S. Pat. No. 4,075,632 to Baldwin et al., filed on May 24, 1976 and issued Feb. 21, 1978, which is herein incorporated by reference in its entirety.

In the general packaging of semiconductor chips, leadframe structures are known in the art. One embodiment for semiconductor memory chip packaging is disclosed in U.S. Pat. No. 4,916,519 to Ward, filed on May 30, 1989 and issued on Apr. 10, 1990. The structure includes the use of an etched or stamped metal foil that is joined to the chip to be packaged. The chip is connected electrically to the leadframe by means of thin wirebond interconnections. The chip and the inner areas of the leadframe are encapsulated using a rigid organic molding compound. Elements of the leadframe protrude from the package so as to permit electrical connection by means of soldering to a circuit board.

Eberhardt et al., WO 94/18700 filed Feb. 14, 1994 teach that it is possible to use leadframe technology for the manufacture of RFID tags. Here the leadframe serves as a support structure for a chip and coil antenna and capacitor. Connections are made to the leadframe from the chip by means of thin wirebonding. The coil antenna is electrically connected to the leadframe as may be a capacitor. As in the example of Ward, the components are sealed using an organic plastic or epoxy molding compound. Elements of the metal leadframe extend outside of the molded portion of the package.

STATEMENT OF PROBLEMS WITH THE PRIOR ART

Prior art teaches that there is a long felt need to manufacture thin RF ID tags on flexible substrates. However, while the goal of a thin flexible tag is desired, much of the prior art has failed to reach the goal. One prior art reference discloses a tag that is 1.5 to 2.0 mm thick. This tag thickness limits the applications of this tag. For example, it is far thicker than the International Standards Organization, ISO, standard credit card thickness of 0.76 mm and therefore could not be used in a credit card to be inserted into a credit card reader. Thickness of the Eberhardt package will be greater than the credit card thickness because of its use of wirebond interconnections. The thinnest packages available today which use the combination of leadframe, wirebonds, and epoxy encapsulation are 1 mm thick or thicker. The addition of the coil to the Eberhardt package insures that the package will be at least 1.5 mm, but most likely 2 to 3 mm thick. The Eberhardt package embodiment that shows a capacitor will be at least 2 mm thick in order to include the bulk of the capacitor. The Eberhardt package is too thick for inclusion in a credit card.

One prior art reference discloses a package with a total thickness of 0.8 mm. This is still greater than the ISO standard credit card thickness of 0.76 mm. Furthermore, while thin elements are disclosed, no care is taken to use flexible materials throughout. The components are mounted on a hard circuit card and encapsulated in plastic. (Hard means can not be torn easily by hand.) The result a is rigid package. Much of the prior art has not shown the use of thin flexible laminate covering materials for the packages. The results are that the packages are thick, and inflexible.

The prior art has also failed to make thin, flexible radio frequency transponders because there is at least one component, the antenna, that must be packaged external to the radio frequency circuit that is using the antenna to transmit/receive signals. Since there are at least these two components in prior art transponders, these components had to be mounted on some sort of substrate or circuit card in order to provide support for the components and to position the components relative to each other. These substrates/cards add thickness to and limit the flexibility of the package.

In addition, the prior art often needs structures in the transponder package used to connect, support, and position the antenna and chip components. These structures add complexity, thickness, and inflexibility to the package. Layers, in addition to the substrate/circuit board, are sometimes added to position the radio frequency circuit and antenna in three dimensions so that electrical bonds among the components can be made. For example, one substrate might be required to support and position the radio frequency circuit while one or more other layer of substrate might be required to support and raise the antenna to the elevation of connections on the radio frequency circuit. The antenna and connecting conductors often require more than one plane of electrical wiring, i.e., the designs use crossovers for completing interconnections. Components are often are stacked one upon the next.

The prior art has not solved the problem of building a transponder package with a minimum of component support; a minimum of strong, thin, and flexible components; and a minimum of interconnections among components.

There are other problems with some prior art structures and packaging. Some prior art has metal leadframe elements protruding from its packaging. These elements are not used for externally connections but result from the limitations of package structure design and the process used to manufacture it. These protruding elements cause several problems. Since they are connected internally to the chip, the chip may be damaged by electrostatic discharge damage (ESD). The protruding metal elements are lightning rods for ESD. In addition, in corrosive environments, tag packages with protruding metal are inadequate. For example, a requirement for laundry service is that the package provide resistance to corrosion. Chlorine bleaches containing large numbers of corrosion-inducing chlorine ions are used in the laundry process. The interface between the metal elements and the epoxy molding is a channel for the transport of chlorine ions into the package. The metal elements themselves may also corrode and dissolve as a result of their immersion in a chlorine ion rich laundry environment.

OBJECTS OF THE INVENTION

An object of this invention is an improved RF transponder apparatus.

An object of this invention is an improved thin, flexible RF tag apparatus that has a minimum of components and connections.

An object of this invention is an improved thin, flexible RF tag apparatus that has a minimum of components and connections that is completely protected by a protective surrounding.

An object of this invention is an improved thin, flexible RF tag apparatus that has a minimum of components and connections that are unsupported by a substrate layer.

An object of this invention is an improved thin, flexible RF tag that has components that are not rigidly attached to a protective surrounding so that shear forces between the protective surrounding and the components are reduced when the transponder is mechanically flexed.

SUMMARY OF THE INVENTION

The present invention is a novel radio frequency transponder (tag) that has a minimum of components and connects and that is thin and flexible because these components and connects can be unsupported by a substrate layer. This is accomplished by using a conducting leadframe structure not only as a connection medium but also as a circuit element, i.e., the transponder antenna. In various preferred embodiments, the leadframe is mechanically positioned and fixably attached to a circuit chip so that the leadframe (antenna) is self supporting. In some preferred embodiments, a protective coating can be added where the leadframe is attached to the circuit chip to protect the surface of the chip from corrosion and abrasion, to exclude light (in some embodiments) from impinging on the circuit chip, and to strengthen the mechanical connections of the leadframe antenna structure that are fixably attached to the electrical connectors on the circuit chip. Further, some preferred embodiments have a protective surrounding that envelops the entire leadframe antenna, circuit chip, and, if provided, the protective coating. The protective surrounding provides resistance to corrosion and abrasion to the leadframe antenna and the circuit chip. In alternative embodiments, the protective surrounding can comprise more than one layer. The protective surrounding further can be made of materials that do not rigidly attach to the leadframe antenna so that shear forces between the leadframe antenna and the protective surrounding are reduced when the antenna is mechanically flexed.

BRIEF DESCRIPTION OF THE DRAWINGS

FIG. 1, comprising

FIG. 2, comprising

FIG. 3, comprising

FIG. 4, comprising

FIG. 5, comprising

FIG. 6 is a plan view of the radio frequency circuit with a leadframe antenna and an alternative preferred positioner with a window.

FIG. 7 is a plan view of the radio frequency circuit with a leadframe antenna and alternative preferred positioners.

DETAILED DESCRIPTION OF THE INVENTION

Figure 1A:
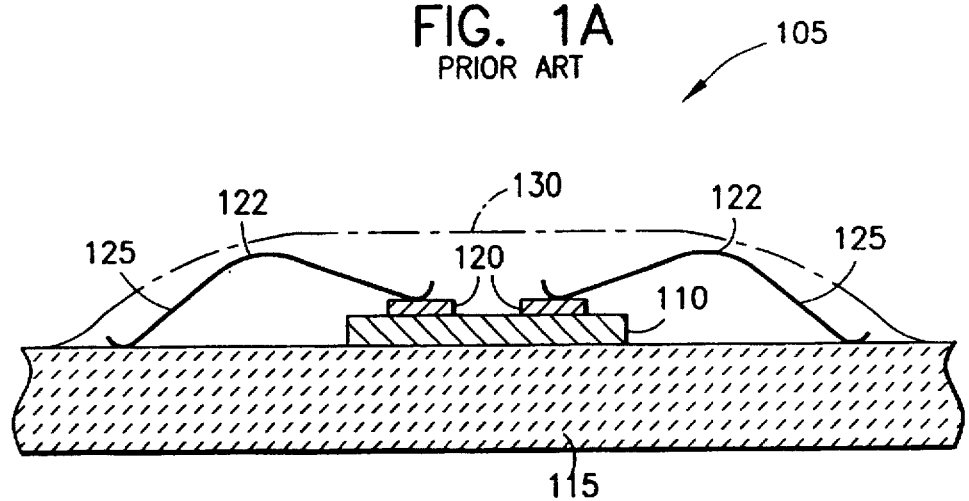
FIG. 1A and FIG. 1B, is a diagram showing the cross section of two typical known structures.
Figure 1B:
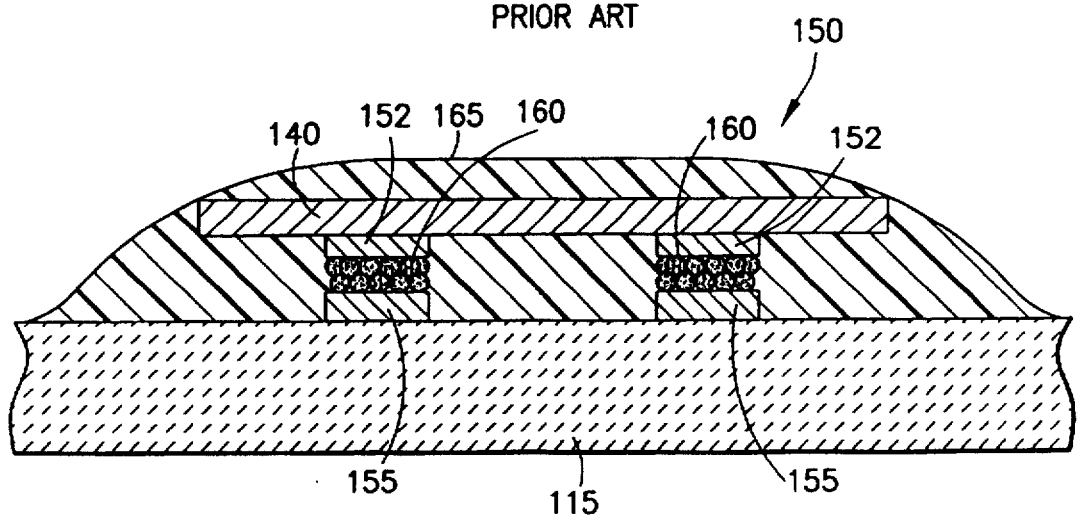
Figure 2A:
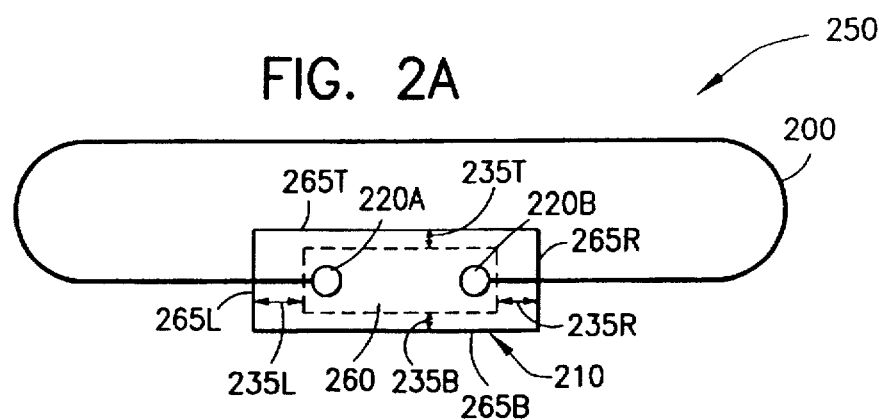
FIGS. 2A–2F, is a drawing of a preferred embodiment of the present radio frequency circuit with a leadframe antenna in top view (FIG. 2A), elevation (FIG. 2B), elevation with protective coating (FIG. 2C), elevation with protective coating and surrounding (FIG. 2D), an elevation with protective surrounding (FIG. 2E), and an elevation with a protective coating sandwiched between the circuit and an overlayer where the protective coating forms a fillet region at the circuit edges (FIG. 2F).
Figure 2B:
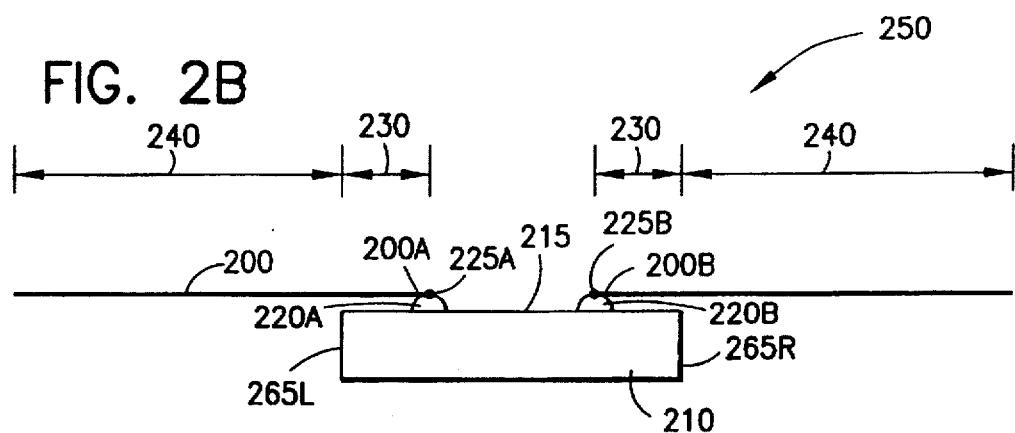

FIG. 2A is a plan view and FIG. 2B is a front view (elevation) of one preferred embodiment of the present invention.

The embodiment comprises a circuit chip that is a radio frequency transponder 210. The circuit chip has a surface 215 and edges 265 (e.g. 265L, 265R, 265B, and 265T) with one or more connectors 220 (e.g. 220A and 220B) that connect to the circuitry within the circuit chip. The circuit chip 210 also has a center portion 260 that is on the surface of the circuit chip, includes the connectors 220, and is a given distance 235 (e.g. 235L, 235R, 235B, and 235T) from any of the respective circuit chip edges 265. Typically this circuitry includes a radio frequency circuit for receiving and transmitting radio frequency signals, a memory for storing information, and logic and other digital circuits for control and communication protocols. Circuit 210 like this are well known. See for example the Anders patent incorporated above. Another novel, circuit is disclosed in U.S. patent application Ser. No. 08/303,965 to Cesar et al. filed on Sep. 9, 1994 that is herein incorporated by by reference in its entirety. While the most preferred use of this invention is that of a circuit chip 210 that is a radio frequency transponder, specifically an RFID tag, any semiconductor chip circuit 210 can be can be attached to a lead frame structure in the manner embodying this invention.

The antenna 200 is constructed from a leadframe. This leadframe antenna 200 is made from a material that is electrically conductive and has a degree of stiffness that permits the antenna to flex within a given amount when supported at one or more ends. The stiffness is characterized by Young's Modulous which is defined as the stress require to produce a unit of strain. The strain may be a change of length. The desired range of Young's Modulus of the leadframe material is on the order of 12×10exp11 dynes per square cm (17.5×10exp6 pounds per square inch) or greater. The leadframe antenna 200 can be designed in various shapes that are described below. However, the leadframe antenna 200 will have at least two ends (200A, 200B) at least one 200A of which is electrically attached 225 to one of the connectors 220 of the circuit chip 210. In some preferred embodiments, the end of the leadframe 200 that is fixably attached 225 has any of the following end shapes: flat, crescent, off set, angle, and ball.

The leadframe antenna 200 will also have a section called an overlapping length 230 that overlaps the surface 215 of the circuit chip 210. The overlapping length 230 is the portion or portions of the leadframe antenna 200 that is between an electrical connection 225 of one end 200A of the antenna 200 and a connector 200 and an edge 265 of the circuit chip 210. The overlapping length 230 includes the point of electrical (an mechanical) attachment 225. An off chip length 240 of the antenna 200 is that portion of the antenna that does not overlap the surface 215 but that is suspended past any of the edges 265.

The leadframe antenna 200 is also mechanically attached to the circuit chip so that it is fixed to the chip at one or more locations on the overlapping length. One of these locations will be the point of electrical connection 225 between the leadframe antenna 200 end 200A, 200B and the connector 220A, 220B, respectively. This fixable attachment permits no mechanical movement at the point of attachment 225A,B. Any prior art connection that provides a fixed mechanical and an electrical connection between the leadframe antenna 200 end (200A, 200B) can be used.

In addition to fixably attaching the leadframe antenna 200 end(s) 200A,B at the connector(s) 220A,B, the fixed attachment can include other mechanical attachments between the overlapping length(s) 230 and the circuit chip 210 and/or chip surface 215. In some preferred embodiments, the fixed attachment includes the adhesive effects of a protective coating (described below) that is placed between the overlapping length 230 and the chip surface 215 and/or in other locations to attach the overlapping length 230 to the surface 215 so that there is no movement between the overlapping length 230 and the surface 215.

A leadframe is a punched and/or etched foil. (See FIG. 6 description below.) The materials used are generally copper, copper-alloys, or nickel-iron alloys such as alloy-42. Other electrically conductive materials are envisioned.

Figure 2C:
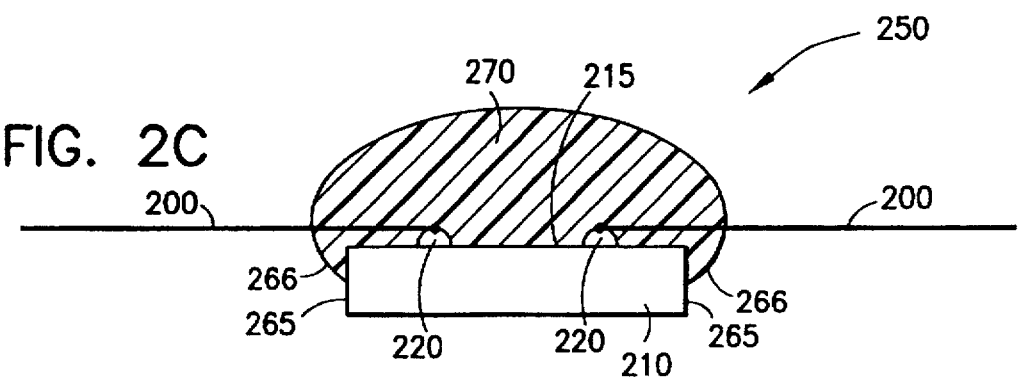

FIG. 2C is a elevation showing the circuit chip 210 with the leadframe antenna 200 that has a protective coating 270. The protective coating covers the circuit chip surface 215 and overlaps the ends (200A, 200B) of the leadframe 200. In a preferred embodiment, the protective coating 270 also overlaps one or more edges 265 of the circuit chip 210 so that the ends (200A,B) of the antenna are mechanically fixed to the chip surface 215 and the chip sides 266. Flowing the protective coating around the chip sides 266, assures that the chip surface 215 is fully covered. This also assures better adhesion of the protective coating 270 to the entire circuit chip surface 215. The flowing of the protective coating over 266 the chip surface 215 and sides 265 further give more support and mechanical strength to the ends (200A,B) of the leadframe.

In a preferred embodiment, the protective coating 270 is made of a polymer material such as epoxies, silicones and urethanes, also known as isocyanates or polyurethanes, which are thermosetting. Additional protective coatings include photopolymers or ultraviolet (uv) curing materials.

Figure 2D:
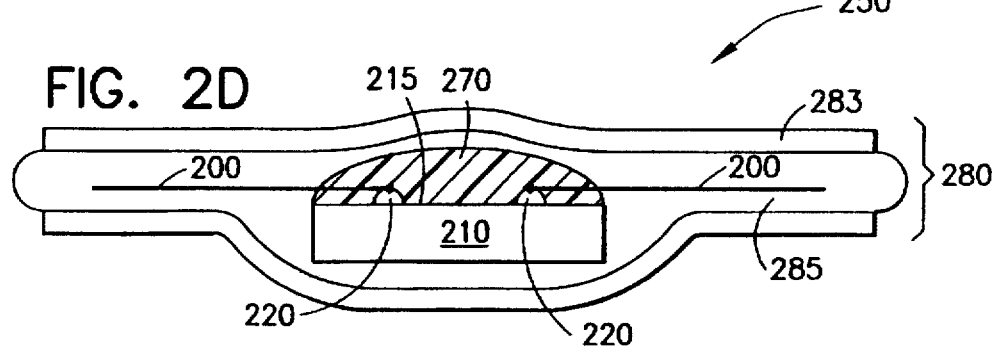

FIG. 2D shows the invention shown in FIG. 2C in an elevation view with protective coating 270 and a protective surrounding 280. In a preferred embodiment, the protective surrounding comprises two layers, an inner layer 285 and an outer layer 283. Alternatively, the entire protective surrounding 280 is made with one layer.

The protective surrounding 280 provides environmental protection for the circuit chip 215 and leadframe 200. The protective surrounding 280 prevents moisture, chemicals, contaminants, corrosive materials, etc. from attacking the circuit chip 215, connections 220, and leadframe 200.

The protective surround 280 also provides mechanical protection from the lead frame against impact, abrasion, cutting, etc. Further the protective surround provides a packaging media providing printing information and a handling media for the transponder. For example, the protective surround 280 can be cardboard or paper, (e.g. a postal package/letter, credit card, or passport, that is used to house to the transponder 250.

Preferrably, the protective surrounding 280 can be made of any one of the following materials: paper, cardboard thermosetting, thermoplastic, or pressure sensitive materials: ethylene acetate, polystyrene, polycarbonate, polypropylene, polyethylene, polyurethane, polyester, polyolefin, nylon, vinyl, silicones, rubber based adhesives, acrylic adhesive, and water soluble adhesives and polyethylene terephthalete (PET), polyethylene naphthalate (PEN), polyetherimide (PEI), polyetheretherketone (PEEK), polysulfone (PS), polyphenylene sulfone (PPS), and polyethersulphone (PES), polyvinyl chloride (PVC), polyester (Mylar), and polyimide (Kapton).

Other uses of transponders and their protective surrounding are given in U.S. patent application Ser. No. 08/303,977 entitled to "Radio Frequency Circuit and Memory in Thin Flexible Package" to Moskowitz et al. which is herein incorporated by reference in its entirety.

The protective surrounding 280 can be applied in two layers (283, 285). In this case the inner layer 285 would have good adhesive and flow characteristics that would cause it to bond well to the leadframe 200 and chip 210 so that the transponder 250 will not delaminate. The outer layer 283 preferably will be resilient and tough to protect the transponder 250 from the environment and mechanical stresses.

Preferred materials used for the inner layer 285 include: ethylene vinyl acetate, acrylic, silicone, rubber, modified epoxies, phenolic, polyester, polyimide, as well as fluoropolymer based adhesives. Materials used for the outter layer (and/or a single layer of protective surrounding 280) include: paper, cardboard, polyethylene terephthalete (PET), polyethylene naphthalate (PEN), polyetherimide (PEI), polyetherether ketone (PEEK), polysulfone (PS), polyphenylene sulfone (PPS), and polyethersulphone (PES), polyvinyl chloride (PVC), polyester (Mylar), and polyimide (Kapton).

Note that, in a preferred embodiment, the protective surrounding 280 (or 283/285) completed surrounds the circuit chip 210 and leadframe 200. This is to protect the leadframe 200 and chip 210 from attack of environmental agents, including electrical sparks, through any path through the protective surrounding 280.

Figure 2E:
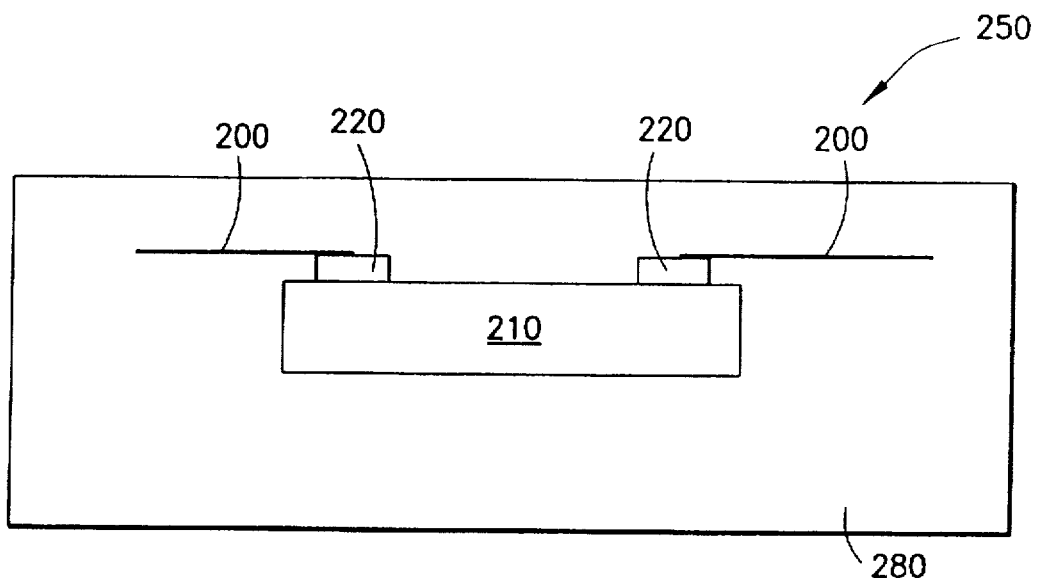

FIG. 2E is an elevation view of a transponder 250 that has a single layer of protective surrounding 280 and no protective coating 270. This embodiment typically would be injection molded by known techniques. This embodiment can be made as a rigid package and any shape and offers very good mechanical support and environmental protection for the leadframe 200 and circuit chip 215. Transponders 250 can be enveloped in injection molded plastic housing that are used as toys, machine parts, covers and containers, etc.

Figure 2F:
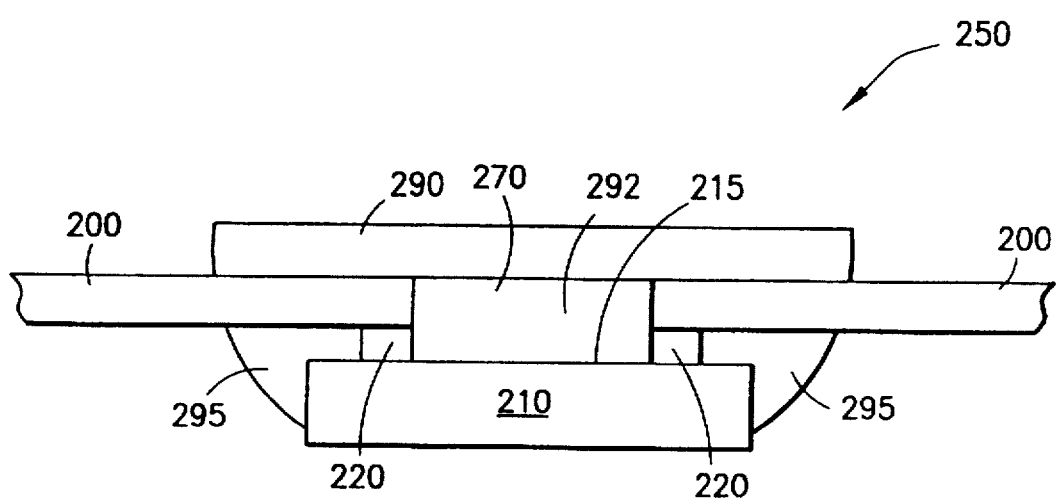

FIG. 2F is an elevation view showing a preferred embodiment of the transponder 250. The transponder 250 has a protective coating 270 sandwiched between the circuit chip 210 and an overlayer 290. The protective coating 270 forms a fillet region 295 between the circuit edges (sides 265) and the underside of the leadframe 200. The overlayer 290 acts as a guide for the protective coating 270 which flows into the region 292 between the overlayer and the chip surface 215 as the protective coating 270 "wicks" from the under side of the leadframe 200. The overlayer 290 accurately determines the thickness of the protective coating 270 by defining the region 292 and also insures that protective coating 270 completely covers the chip surface 215. The fillets 295 offer additional mechanical support of the leadframe 200 and bounding of the leadframe 200 to the chip 210.

In one preferred embodiment, the overlayer has a length, width, and position over the chip surface 215 that causes the overlayer to extend past the connectors 220 on the chip 210. In another preferred embodiment, the overlayer has a length and position that causes the overlayer to extend past the sides 265 of the chip 210 This is done so as to form a better fillet 295.

Note that FIGS. 2A–2F show that in one preferred embodiment of the transponder, there is only one plane of conductive material (e.g., metalization) which is the leadframe antenna 200. (The connectors 220 on the chip surface 215 fall slightly out of this plane by a very small amount, i.e., the thickness of the connector 220 and the connection 215.) This is made possible by the stiffness of the leadframe antenna 200 and the fixed mechanical attachment of the antenna at the connector (and other places if the protective coating 270 and surround 280 are used.) Since there is only one layer of conductive material, the transponder is more flexible has a thin profile.

FIG. 3, comprising FIGS. 3A, 3B, 3C, and 3D, is a diagram showing the plan view (FIG. 3A) and various cross sections (FIGS. 3B–3D) of a preferred RFID tag with a leadframe antenna and a protective surrounding 280.

Figure 3A:
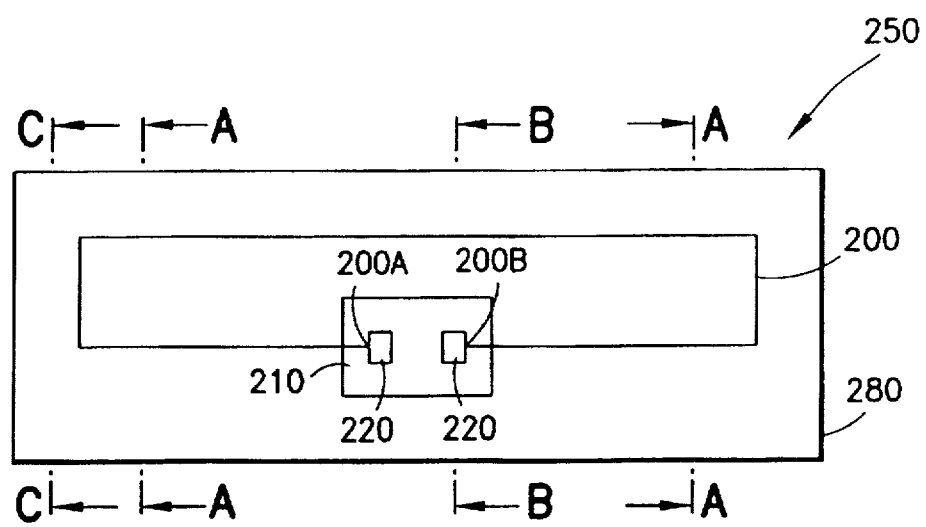
FIGS. 3A, 3B, 3C, and 3D, is a diagram showing the plan view (3A) and various cross sections (FIGS. 3B–3D) of a preferred RFID tag with a leadframe antenna and a protective surrounding.

FIG. 3A shows an elevation of the transponder 250 with cross sections taken at the: off chip 240 parts of the leadframe antenna 200 (AA); overlapping length 230 of the frame antenna 200, specifically at the connection 225 (BB); and part(s) of the transponder where there is no leadframe antenna 200 (CC).

Figure 3B:
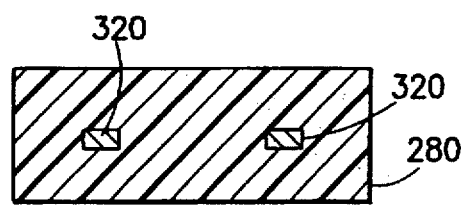

FIG. 3B shows a cross section(s) (AA) of the transponder 250 at the off chip length 240 of the leadframe antenna 200. In this cross section, the only components are the leadframe antenna (200, 320) surrounded by the protective surrounding 280. In the off chip 240 section of the leadframe antenna 200, the leadframe antenna 200 is suspending in and surrounded by the protective surrounding 280 with no other supporting structure, e.g. a substrate. Therefore, this transponder 250 can be very thin because the only structures required in the off chip 240 sections of the transponder 250 (and leadframe antenna 200 of the transponder 250) are the leadframe antenna 200 element and the protective surrounding 280. Although the transponder 250 is thin, it is mechanically strong and environmentally resistant because of the combined strength of the leadframe 200 and the protective surrounding 280.

Figure 3C:
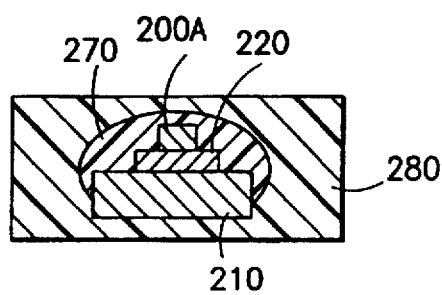

FIG. 3C shows a cross section (BB) of the transponder 250 a the chip 210 with the ends 210 overlapping a portion or length 230 of the chip surface 215. (This cross section is specifically at the connection 225.) This cross section also shows the protective coating 270 and the leadframe 200 end 200A connected to the chip connector 220.

Figure 3D:
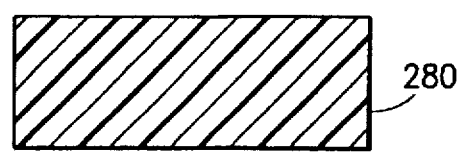

FIG. 3D shows a cross section (CC) of the transponder 250 taken at a point where there is no leadframe 200. This cross section comprises only protective surrounding 280 and illustrates that the transponder 250 is completely surrounded by the protective surrounding 280 so that no path exists for environmental contaminants to enter and attack the leadframe 200, leadframe end 200A,B, connections 220, and/or chip 210.

Note that the protective surround 280 described in FIG. 3 could also comprise and inner 285 and an outer 283 layer as disclosed above.

FIG. 4 shows various leadframe antenna structures that are created by stamping and/or etching various shapes on the leadframe metal. Again, the off chip length can be suspended with with no substrate or other support due to the stiffness of the leadframe 200 (420). See definition of Young's Modulus above.

Figure 4A:
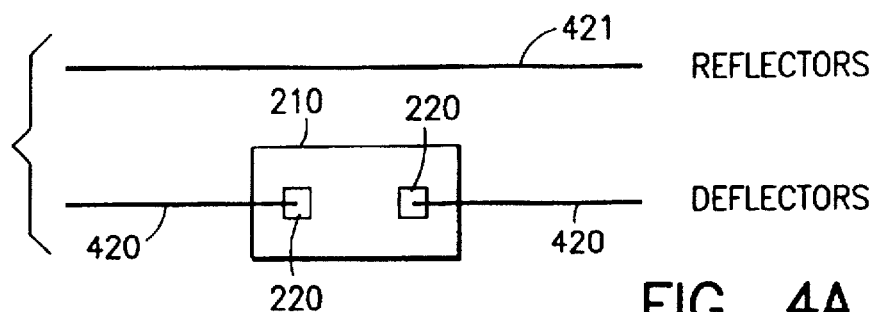
FIGS. 4A, 4B, 4C, 4D, 4E, 4F, 4G, and 4H, is a set of plan views showing example preferred alternative antenna designs that can be used with the present invention.

In FIG. 4A there is a dipole antenna 420 attached to the chip 210 connector 220 along with a parasitic element 421 like a antenna director or reflector.

Figure 4B:
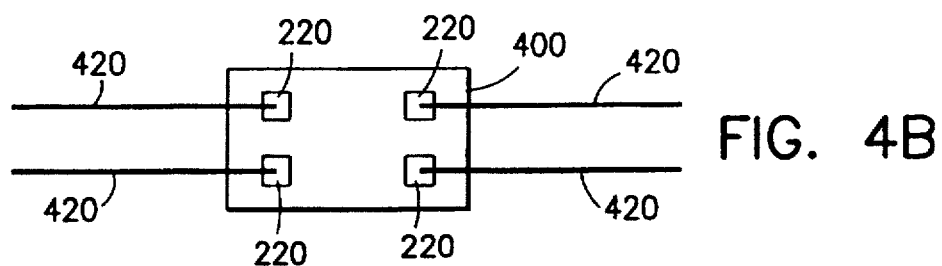

In FIG. 4B a double dipole antenna 420 is stamped and/or etched and attached (electrically and mechanically) to a connector 210 on the chip 400. (Hereafter, chips 400 are variations of chip 210. For example, in FIG. 4B, chip 400 has two pairs of connectors 220.) Alternatively, the two dipoles 420 can be of different lengths and therefore of different frequencies controlled by two separate oscillators on the chip 400.

Figure 4C:
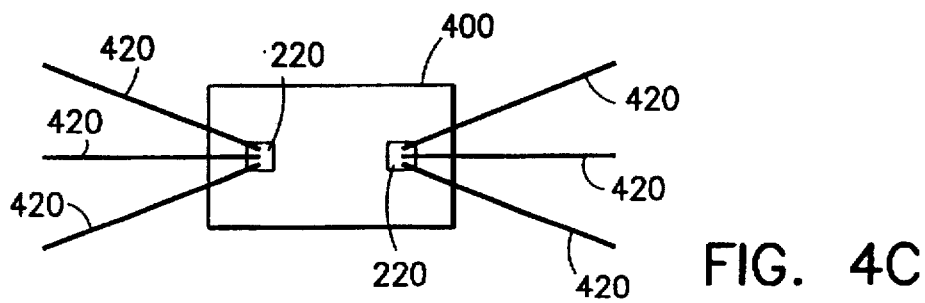

In FIG. 4C, the leadframe antenna structure is a "whisker structure" that has multiple elements to improve the range and directionality of the antenna.

Figure 4D:
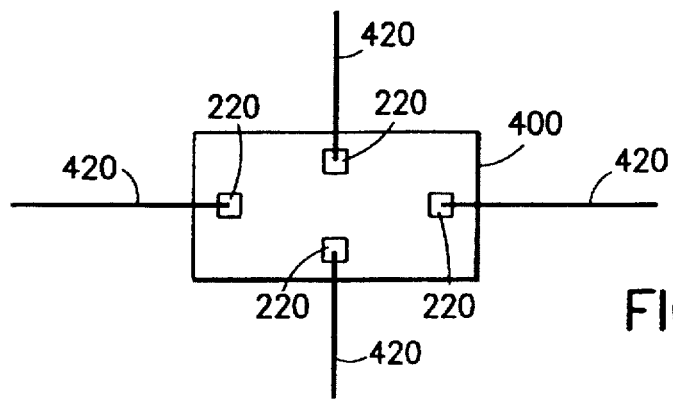

In FIG. 4D, two dipolar antennas 420 are stamped and/or etched from the leadframe to produce an antenna that has elements that are orthogonal or nearly orthogonal so that the range and directionality of the antenna is enhanced.

Figure 4E:
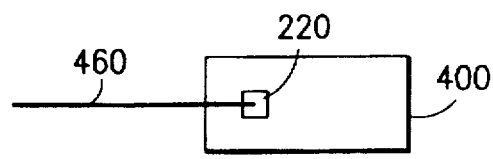

FIG. 4E shows a monopolar antenna 460.

Figure 4F:
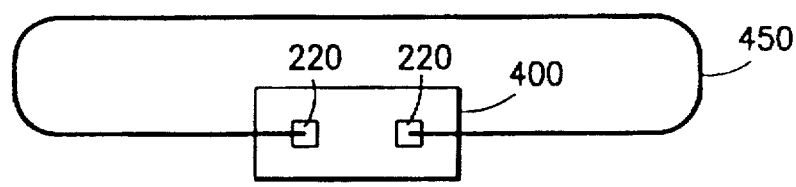
Figure 4G:
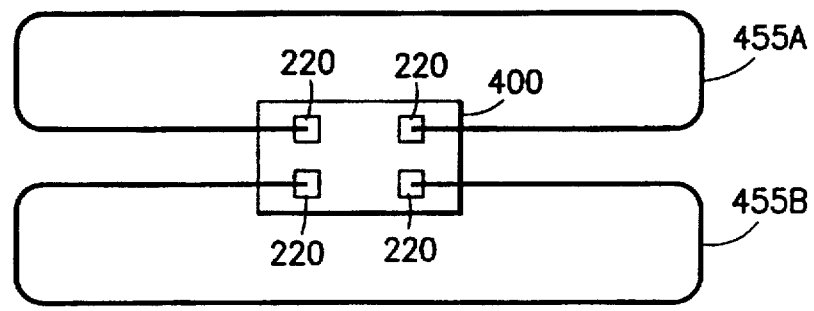

FIG. 4F shows a single loop antenna 450, while FIG. 4G shows a multiple loop antennas 455 (A,B).

These and other antenna structure are disclosed in U.S. patent application Ser. No. 08/303,976 to Brady et al. which is herein incorporated by reference in its entirety.

Figure 4H:
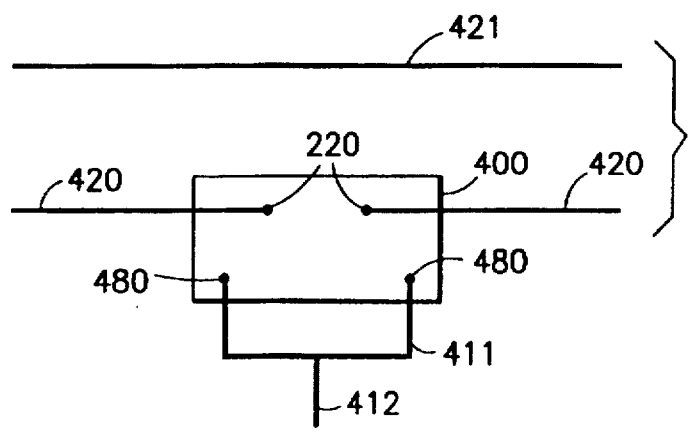

Further, FIG. 4H is a top view as shown in FIG. 4A with the addition of two dummy chip contacts 480. The dummy contacts 480 are connected by a dummy metal connector 411 with a protruding piece 412. The dummy contacts 480 with the dummy metal connector 411 provide a mechanical structure on the opposite side of the chip from the antenna connections 220. The structure that is formed at the connectors (220 and 480) at any position on the surface 215 of the chip at the same elevation with respect to a head that makes physical contact with the chip connectors (220 and 480) during the connection of the antenna 420 (and dummy metal connector 411) so that the physical contact (impact) of the head does not rotate and/or cause torsional stress to the chip 400. The protrusion 412 provides a connection to an unused portion of the leadframe for mechanical support while the chip 400 is being attached to the leadframe antenna 420 (with optional 421.) After the chip 400 is attached to the leadframe antenna, the protrusion 412 is cut. See "Method of Making a Thin Radio Frequency Transponder", to Brady et al., U.S. patent application Ser. No. 08/621,385, filed on the same day as this application to Brady et al., which is herein incorporated by reference in its entirety. (Further note that the leadframe antenna antenna 420 and/or the dummy mechanical connector 411 can be connected to the chip contacts 220 (dummy contacts 480) by any one or more known connection methods including compression bonding, ultrasonic bonding, thermal sonic bonding, and laser sonic bonding. For some bonding techniques see U.S. patent application Ser. No. 08/330,288 entitled Method of Making Radio Frequency Identification Tags, to Brady et al. filed on Oct. 27, 1994.

All these various antenna structures described above, and others, can be electrically connected to the chip (210, 400), with protective coatings 270, and/or protective surrounds 280 as described in FIG. 2 above.

Figure 5A:
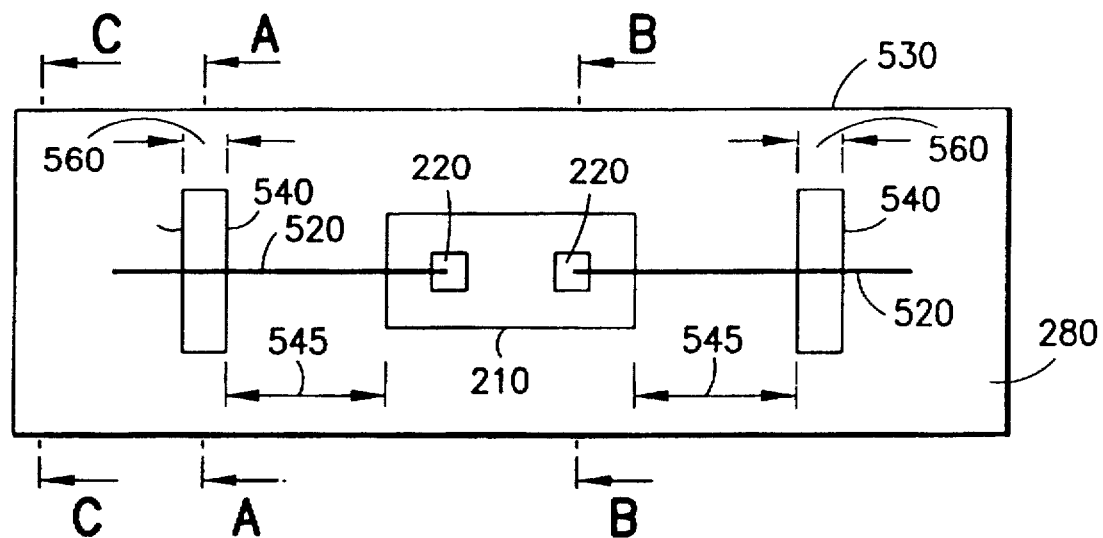
FIGS. 5A and 5B, is a diagram showing the plan view (FIG. 5A) and a cross sections (FIG. 5B) of a preferred structure having positioners attached to the off chip length of the lead frame antenna.

FIG. 5A is a plan view of one preferred embodiment of the present leadframe structure 530 using positioners 540 to position the leadframe elements of the leadframe antenna 520 (200, 420, etc.). A positioner 540 is an organic film strip or tape that maintains the position of the leadframe antenna 520 with respect to the chip 210, 400, etc.) and also provides additional support for the antenna 520. In particular, the positioners 540 provide extra strength for the antenna elements 520 during the assembly process when the antenna elements 520 are attached to the chip contacts 220 and further are cut from any unused portion of the leadframe that may be providing support before the leadframe antenna 520 is packaged in structure 530. (Here antenna 520 can be any of the antenna embodiments described above and the chip can be any of the chips described above.)

The positioners 540 are typically between 10 and 125 microns in thickness. More preferably, they 540 are between 15 and 50 microns in thickness. Examples of materials used for the positioners 540 include: thermosetting materials; thermoplastic materials; or polyimide. Mylar (polyester) is a material which may be used.

Typically, the positioners 540 are placed as close as possible to the chip 210. In a preferred embodiment, this distance 545 is between 0.15 and 0.75 millimeters. More preferably, the distance about is 0.175 to 0.5 millimeters. However, this distance is dictated by current manufacturing technology. If this manufacturing technology would allow closer placement of the positioners 540 to the chip without infringing on the surface of the chip, closer placement of the positioners 540 would be used, if cost effective. Typically the positioners 540 have a positioner width 560 between 0.25 and 5 millimeters. More preferably, the positioner width 560 is between 0.5 and 2.5 millimeters.

Note however, that the distance 545 needs to insure proper wicking (see, for example, FIGS. 2C and 2F) of any encapsulant that would cover the chip along with the leadframe antenna end (200A, B) connected to the contact 225 and overrun onto the sides 265 of the chip to form a "fillet. (266, 295)" For proper wicking to occur, the gap distance 545 should be wide enough so that the encapsulant 270 can flow but not too wide so that the encapsulant fall through the gap 545. In practice the gap distance 545 should be at least 0.18 millimeters (about 7 mils.)

Figure 5B:
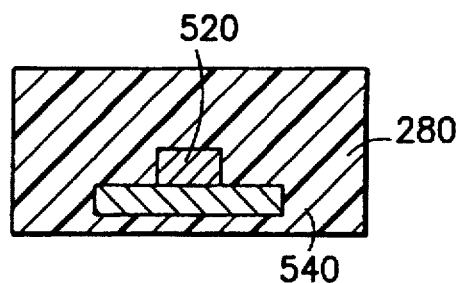

Cross sections B—B and C—C of FIG. 5A are identical to cross sections B—B and C—C of FIGS. 3C and 3D, respectively, described above. FIG. 5B is a cross section A—A of Figure 5A showing the leadframe antenna element 520 and the positioner 540 enclosed in the protective surrounding 280.

Typicallly the positioners are located on the same side of the leadframe as is the chip. This is done so as to not increase the thickness of the total package. If both the chip and the positioners are attached on the same side of the leadframe, the maximum thickness of this part of the package is that of the leadframe plus that of the thickest of the chip or the positioners. If the chip and the positioners were on opposite sides of the leadframe, the total thickness would be the sum of the thickness of all three elements.

FIG. 6 is a plan view of the radio frequency circuit with a leadframe antenna (620, 621) (or any of others described above) and an alternative preferred positioner 640. This positioner 640 has a positioner width 610 that is wide enough to cover the chip (210, 400, etc.) and two times the gap (typically 615 or the sum of the gaps 615L and 615R), while still overlapping 625 some of the leadframe antenna 620. The gaps 615 on the (right 615R and left 615L) sides of the chip 210 and the gaps 620 on the top 630T and bottom 630B sides of the chip form a window 650 in which the chip 210 sits. In a preferred embodiment, as described above, all the gaps (615L, 615R, 630T, 630B) are wide enough to allow an encapsulant to flow between the chip 210 sides 265 and the positioner 640 so that the encapsulant wicks and forms a fillet attaching to the sides 265 of the chip 210. This embodiment requires that the manufacturing process position the chip 210 within the window 650 so that the correct gaps (615, 630) are created. The positioner 640 can be made as thick and made of the same material as the positioners described above.

FIG. 7 is a plan view of the radio frequency circuit with a leadframe antenna 420 (421) and alternative preferred positioners 740 that are positioned on either side of the chip (210, 400, etc.). The gaps 715 on the left 715L and right 715R sides of the chip 210 form a trough or channel 730 in which the chip 210 sits. As described above, in a preferred embodiment, the gaps 715 are wide enough to allow an encapsulant to flow between the sides 265 of the chip 210 and the positioner(s) 740 so that the encapsulant wicks and forms a fillet attaching to the side(s) 265 of the chip 210. This embodiment requires that the manufacturing process position the chip 210 within the trough 730 so that the correct gaps 715 are created. The positioners 740 can be made as thick and made of the same material as the positioners described above. Typically the positioners 740 have a positioner width 760 between 0.25 and 5 millimeters. More preferably, the positioner width 760 is between 0.5 and 2.5 millimeters. The positioners 740 are placed preferably so that the gap 715 is 0.5 mm or less, and more preferable so that the gap 715 is 0.25 mm or less.

Figure 8A:
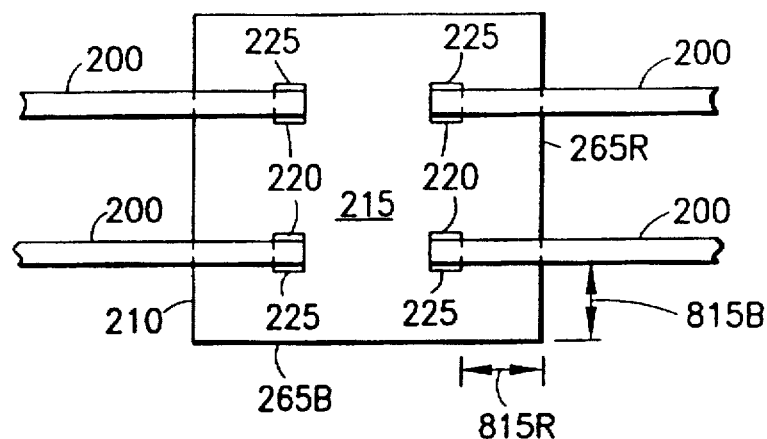
FIG. 8, comprising FIGS. 8A–8C, showing a plan view of "centering" circuit chip connectors (FIG. 8A), a plan view of alternative attachments to "centered" circuit chip connectors (FIG. 8B) and a side view (FIG. 8C) with a protective coating.
Figure 8B:
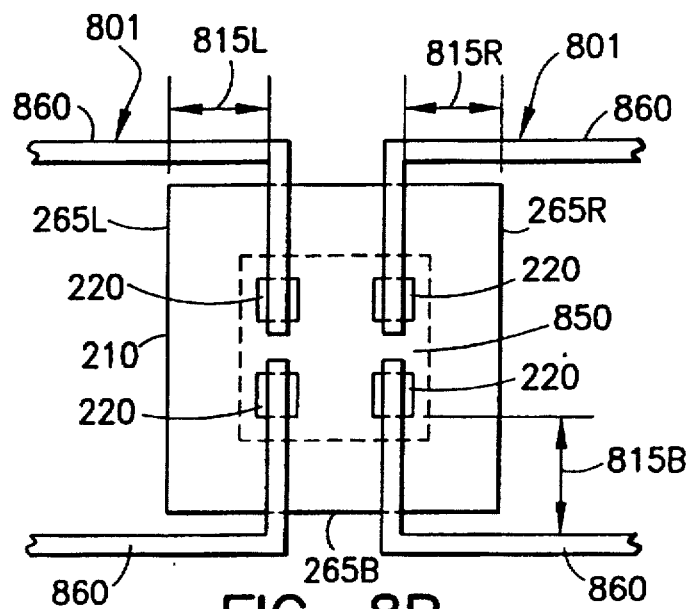
Figure 8C:
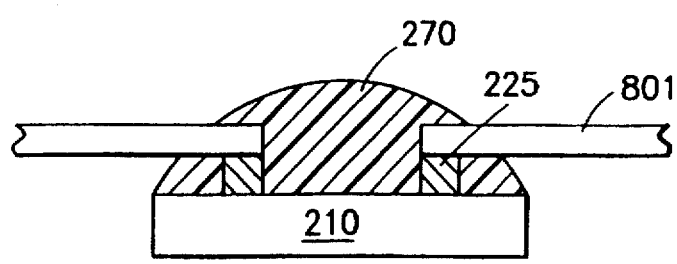

FIG. 8, comprising FIGS. 8A–8C, shows a plan view of "centering" circuit chip connectors 220 (FIG. 8A), a plan view of alternative attachments to "centered" circuit chip connectors 220 (FIG. 8B) and a side view (FIG. 8C) with a protective coating 270. Positioning the connectors in this manner reduces or removes the requirement for positioners (540, 640, and 740) to hold the encapsulant 270 so as to form a dome of encapsulant 270 over the chip.

In FIGS. 8A and 8B, the lea(lframe antenna leads 200 (any antenna structure described above) are positioned over 230 and bonded 225 to the chip connectors 220 on chip 210. The chip connectors 220 are located a minimum distance 815 from each of the sides 265 of the chip 210. Specifically, the connectors are located on the chip surface 215 at: a distance 815L from the left side 265L, a distance 815R from the right side 265R, a distance 815B from the bottom side 265B, a distance 815T from the left side 265T of the chip 210. Placement of the chip connectors 220 in this manner "centers" the chip connectors in a center region 850 on the surface of the chip 210. This centering provides a larger overlapping length 230 which provides a stronger mechanical connection of the leadframe antenna 200 (etc.) to the chip 210. In a preferred embodiment, the distance 815 is between 0.25 mm and 0.5 mm. More preferably the distance 815 is about one quarter of the width of chip for small chips.

In FIG. 8B, one or more of the leadframe antenna elements 801 has a bend 860. This is done so as to releave the stress from mechanical bending or thermal mismatch of expansion coefficients of the different materials of the package.

In FIG. 8C, a dome of encapsulated 270 is deposited over (the chip 210 in such a way as to cover the chip connectors 225 with a protective coating 270.

Figure 9:
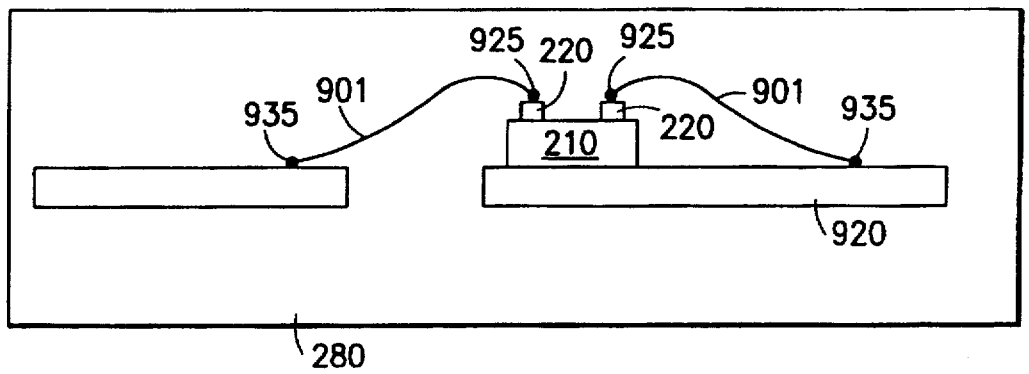
FIG. 9 is a side view of an alternative preferred embodiment showing the circuit chip supported by and wire bonded to the lead frame antenna structure.

FIG. 9 is a side view of an alternative preferred embodiment 900 of the present structure showing the circuit 210 supported by and bonded to the leadframe antenna 920 (200 etc.) structure. The wirebond wires 901 are bonded to the leadframe antenna 920 to form connections 935 to the antenna 920. The wires 901 are bonded 225 to the connection pads 220 on the chip 210 at their chip termination ends (200A,B). The chip 210 is located on the leadframe 920 while the whole structure is surrounded by a protective material 280.

Given the above disclosure, alternative equivalent embodiments would become apparent to one skilled in the art. These embodiments are within the contemplation of the inventors. For example, any one of the antenna structures disclosed could be used with any one of the positioniers disclosed. Alternatively, no positioners could be used. Also, the radio frequency package may or may not use any one of the protective coating and/or protective surrounds.

We claim:

1. A radio frequency transponder comprising:
   a. a circuit chip having a surface with one or more connectors; and
   b. a self-supporting leadframe antenna, said self-supporting leadframe antenna being an electrically conductive self-supporting foil of a material having a Youngs's Modulus on the order of $12 \times 10^{11}$ dynes per square centimeter of greater, said self-supporting foil having no supporting substrate and having two or more ends, one or more of the ends being electrically attached to one of the connectors on the circuit chip, the self-supporting foil itself forming an antenna for the radio frequency circuit.

2. A transponder, as in claim 1, where one or more of the ends electrical connected to one of the chip connectors is also fixably attached to the chip connector, the leadframe antenna being supported at the chip connector to which it is fixably attached.

3. A transponder, as in claim 2, where the fixably attached end has any of the following end shapes: crescent, off set, angle, and ball.

4. A transponder, as in claim 1, where the electrically conductive foil is made of any of the following: copper, copper alloy, nickel-iron alloy, a metal plated with copper, a metal plated with silver, a metal plated with nickel, and a metal plated with gold.

5. A radio frequency transponder comprising:
   a. a circuit chip having a surface, a radio frequency circuit, and one or more connectors electrically connected to the radio frequency circuit;
   b. a self-supporting leadframe antenna, said self-supporting leadframe antenna being an electrically conductive self-supporting foil of a material having a Young's Modulus on the order of $12 \times 10^{11}$ dynes per square centimeter or greater, said self-supporting foil having no supporting substrate and having two or more ends, one or more of the ends being electrically attached to one of the connectors for the radio frequency circuit, the self-supporting foil itself forming an antenna for the radio frequency circuit, the leadframe having an off chip length and an overlapping length overlapping the surface, at least on of the ends being part of the overlapping length and being electrically and fixably attached to one of the connectors; and c. a protective coating covering the circuit chip surface and the ends overlapping the circuit chip surface.

6. A radio frequency transponder, as claim 5, where the off chip length is unsupported.

7. A radio frequency transponder, as in claim 5, where one or more of the connectors are located within a center portion of the circuit chip so that the protective coating provides additional support for the leadframe antenna, the center portion being on the surface at least 20 mils from any one of one or more sides of the circuit chip.

8. A radio frequency transponder, as in claim 5, where the off chip length of the leadframe antenna is attached to one or more positioners.

9. A transponder, as in claim 5, further comprising a protective surrounding, the protective surrounding being positioned above the connectors of the circuit chip, the protective coating being between the surface and the protective surrounding.

10. A transponder, as in claim 9, where the protective coating further extends around one or more sides of the circuit chip forming a fillet.

11. A transponder, as in claim 9, where the protective surrounding has a length, width, and position that causes the protective surrounding to extend past the connectors.

12. A transponder, as in claim 9, where the protective surrounding has a length, width, and position that causes the protective surrounding to extend past one or more sides of the circuit chip.

13. A radio frequency circuit comprising:
   a. a circuit chip having a surface, a radio frequency circuit, and one or more connectors connected to the radio frequency circuit;
   b. a self-supporting leadframe antenna, said self-supporting leadframe antenna being an electrically conductive self-supporting foil of a material having a Young's Modulus on the order of $12 \times 10^{11}$ dynes per square centimeter or greater, said self-supporting foil having no supporting substrate and having two or more ends, one or more of the ends being a connected end that is electrically and fixably attached to one of the connectors on the circuit chip, the self-supporting foil itself forming an antenna for the radio frequency circuit, the leadframe antenna having an off chip length and an overlapping length overlapping the surface, and at least one of the connected ends being part of the overlapping length; and
   c. a protective surrounding that envelops the circuit chip and the leadframe antenna.

14. A radio frequency transponder, as in claim 13, where one or more of the connectors is located within a center portion of the circuit chip so that the protective surrounding provides additional support for the leadframe antenna, the center portion being on the surface at least 20 mils from any one of one or more sides of the circuit chip.

15. A transponder, as in claim 13, where there is one level of conductor over the entire off chip length.

16. A radio frequency circuit, as in claim 13, where the off chip length of the leadframe antenna comprises a single layer and where a cross section of the transponder at any location on the off chip length of the leadframe antenna comprises only the leadframe antenna and the protective surrounding.

17. A radio frequency circuit, as in claim 13, where the off chip length of the leadframe antenna is attached to one or more positioners.

18. A radio frequency transponder comprising:
   a. a circuit chip having a surface and a radio frequency circuit, and one or more connectors connected to the radio frequency circuit;
   b. a self-supporting leadframe antenna, said self-supporting leadframe antenna being an electrically conductive self-supporting foil of a material having a Young's Modulus on the order of $12 \times 10^{11}$ dynes per square centimeter of greater, said self-supporting foil having no supporting substrate and having two or more ends, one or more of the ends being a connected end that is electrically and fixably attached to one of the connectors on the circuit chip, the self-supporting foil itself forming an antenna for the radio frequency circuit, the leadframe antenna having an off chip length and an overlapping length, the off chip length not overlapping the surface and the overlapping length overlapping the surface, at least one of the connected ends being part of the overlapping length; and
   c. a protective coating covering the connectors and at least a portion of the chip surface; and
   d. a protective surrounding that envelops the circuit chip, the protective coating, and the leadframe antenna.

19. A transponder, as in claim 18, where the protective coating is made of any one of the following polymer materials: epoxies, silicones and urethanes, also known as isocyanates or polyurethanes, which are thermosetting, additional protective coatings include photopolymers or ultraviolet (uv) curing materials.

20. A transponder, as in claim 18, where the protective surrounding is made of any one of the following materials: paper, cardboard thermosetting, thermoplastic, or pressure sensitive materials: ethylene acetate, polystyrene, polycarbonate, polypropylene, polyethylene, polyurethane, polyester, polyolefin, nylon, vinyl, silicones, rubber based adhesives, acrylic adhesive, and water soluble adhesives and polyethylene terephthalete (PET), polyethylene naphthalate (PEN), polyetherimide (PEI), polyetherether ketone (PEEK), polysulfone (PS), polyphenylene sulfone (PPS), and polyethersulphone (PES), polyvinyl chloride (PVC), polyester (Mylar), and polyimide (Kapton).

21. A transponder, as in claim 18, where the protective coating is injection molded material.

22. A transponder, as in claim 18, where the protective surrounding comprises an inner and an outer layer.

23. A transponder, as in claim 22, where the inner layer in made of any one of the following materials: ethylene vinyl acetate, acrylic, silicone, rubber, modified epoxies, phenolic, polyester, polyimide, as well as fluoropolymer based adhesives.

24. A transponder, as in claim 22, where the outer layer in made of any one of the following materials: paper, cardboard, polyethylene terephthalete (PET), polyethylene naphthalate (PEN), polyetherimide (PEI), polyetherether ketone (PEEK), polysulfone (PS), polyphenylene sulfone (PPS), and polyethersulphone (PES), polyvinyl chloride (PVC), polyester (Mylar), and polyimide (Kapton).

25. A radio frequency transponder comprising:
   a. a circuit chip having a surface and one or more connectors on the circuit chip;

b. a self-supporting leadframe antenna, said self-supporting leadframe antenna being an electrically conductive self-supporting foil of material having a Young's Modulus on the order of $12\times10^{11}$ dynes per square centimeter or greater, said self-supporting foil having no supporting substrate and having two or more ends, one or more of the ends being a connected end that is electrically and fixably attached to one of the connectors on the circuit chip, the self-supporting foil itself forming an antenna for the radio frequency circuit, the leadframe antenna having an off chip length and an overlapping length, the off chip length not overlapping the surface and the overlapping length overlapping the surface, at least one of the connected ends being part of the overlapping length, the leadframe antenna being positioned by one or more positioners attached to the leadframe antenna at one or more locations along the off chip length; and c. a protective coating covering the connectors and at least a portion of the chip surface; and d. a protective surrounding that envelops the circuit chip, the protective coating, and the leadframe antenna.

26. A transponder, as in claim 25, where the positioner is a strip with a window, the circuit chip being located in the window, and the positioner surrounding the circuit chip.

27. A transponder, as in claim 25, where the positioners are strips, each strip located adjacent to a side of the circuit chip.

28. A transponder, as in claim 27, where the positioners are within 0.25 mm of the side of the circuit chip.

29. A transponder, as in claim 25, further comprising a overlayer, the overlayer being positioned above the connectors of the circuit chip, the protective coating being between the surface and the overlayer.

30. A transponder, as in claim 29, where the protective coating further extends around one or more sides of the circuit chip forming a fillet.

31. A transponder, as in claim 29, where the overlayer has a length and position that causes the overlayer to extend past the connectors.

32. A transponder, as in claim 29, where the overlayer has a length and position that causes the overlayer to extend past the sides.

* * * * *